United States Patent
Hsu et al.

(10) Patent No.: US 6,711,064 B2
(45) Date of Patent: Mar. 23, 2004

(54) SINGLE-POLY EEPROM

(75) Inventors: Ching-Hsiang Hsu, Hsin-Chu (TW); Ching-Sung Yang, Chang-Hua Hsien (TW); Shih-Jye Shen, Hsin-Chu (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 10/064,214

(22) Filed: Jun. 21, 2002

(65) Prior Publication Data

US 2003/0235082 A1 Dec. 25, 2003

(51) Int. Cl.$^7$ .............................................. G11C 16/04
(52) U.S. Cl. ............................ 365/185.29; 365/185.18; 365/185.28
(58) Field of Search ...................... 365/185.29, 185.18, 365/185.28, 185.01

(56) References Cited

U.S. PATENT DOCUMENTS

| | | | | |
|---|---|---|---|---|
| 5,841,165 A | * | 11/1998 | Chang et al. | 257/318 |
| 6,166,954 A | * | 12/2000 | Chern | 365/185.14 |
| 6,191,980 B1 | * | 2/2001 | Kelley et al. | 365/185.29 |
| 6,215,700 B1 | * | 4/2001 | Fong et al. | 365/185.1 |
| 6,222,764 B1 | * | 4/2001 | Kelley et al. | 365/185.07 |

* cited by examiner

Primary Examiner—Hoai Ho
(74) Attorney, Agent, or Firm—Winston Hsu

(57) ABSTRACT

A single-poly EEPROM is disxlosed. The single-poly EEPROM includes a first PMOS transistor that is serially connected to a second PMOS transistor. The first and second PMOS transistors are both formed on an N-well of a P-type substrate. The first PMOS transistor includes a floating gate, a first P$^+$ doped drain region, and a first P$^+$ doped source region. The second PMOS transistor includes a gate and second P$^+$ doped source region. The first P$^+$ doped source region of the first PMOS trasistor serves as a drain of the second PMOS transistor. An erase gate extending to the floating gate for erasing the single-poly EEPROM is provided in the P-type substrate.

9 Claims, 9 Drawing Sheets

| Operation | | $V_{SG}$ | | $V_{BL}$ | | $V_{BC}$ | $V_{SL}$ | $V_{NW}$ | $V_{PW}$ |
|---|---|---|---|---|---|---|---|---|---|
| | | Selected WL | Unselected WL | Selected BL | Unselected BL | | | | |
| Program | "1" | 0V | 5~7V | 0V | 5~7V | 0V | 5~7V | 5~7V | 0V |
| | "0" | 0V | 5~7V | 5~7V | 5~7V | 0V | 5~7V | 5~7V | 0V |
| Read | | 0V | 3.3V | 1.8V | 3.3V | 3.3V | 3.3V | 3.3V | 0V |
| Erase | | 0V | | 0~-5V | | 5~7V | 0V | 0V | 0V |

| Operation | | $V_{SG}$ | | $V_{BL}$ | | $V_{BC}$ | $V_{SL}$ | $V_{NW}$ | $V_{PW}$ |
|---|---|---|---|---|---|---|---|---|---|
| | | Selected WL | Unselected WL | Selected BL | Unselected BL | | | | |
| Program | "1" | 0V | 5~7V | 0V | 5~7V | 0V | 5~7V | 5~7V | 0V |
| | "0" | 0V | 5~7V | 5~7V | 5~7V | 0V | 5~7V | 5~7V | 0V |
| Read | | 0V | 3.3V | 1.8V | 3.3V | 3.3V | 3.3V | 3.3V | 0V |
| Erase | | 0V | | 0~-5V | | 5~7V | 0V | 0V | 0V |

Fig. 7

SINGLE-POLY EEPROM

BACKGROUND OF INVENTION

1. Field of the Invention

The present invention relates to a semiconductor device and related operation method. More particularly, the present invention relates to a single-poly electrically erasable programmable read only memory (EEPROM) capable of implementing a rapid edge Fowler-Nordheim erase operation by means of an erase gate thereof and low-voltage data writing through channel hot electron injection (CHEI) mechanism. The single-poly EEPROM according to this invention, which is compatible with standard CMOS fabrication processes, has the advantages of low power consumption, high write/erase efficiency, and high packing density.

2. Description of the Prior Art

Electronic memory comes in a variety of forms to serve a variety of purposes. Flash electrically erasable programmable read only memory (flash EEPROM) is used for easy and fast information storage in such devices as personal digital assistants (PDA), digital cameras and home video game consoles. Generally, an EEPROM chip has a grid of columns and rows with a cell that has two transistors at each intersection. One of the transistors is known as a floating gate, and the other one is the control gate. The floating gate's only link to the row, or word line, is through the control gate. As long as this link it in place, the cell has a value of 1. Changing the value to a 0 requires a well-known process called Fowler-Nordheim tunneling. It is often desirable to combine many functions on a single device, also called as system-on-a-chip (SOC), to reduce the number and cost of chips. Embedding flash memory in a CMOS device allows a single chip produced by a manufacturer to be configured for a variety of applications, and/or allows a single device to be configured by a user for different applications. To combine with standard CMOS process flow, single-poly flash memory devices have been developed.

FIG. 1 is a schematic, cross-sectional view of a prior art single-poly EEPROM cell 10. As shown in FIG. 1, the EEPROM cell 10 comprises an NMOS structure 28 and a PMOS structure 30. Field oxide layer 24 isolates the PMOS structure 30 from the NMOS structure 28. The NMOS structure 28 is formed on a P-type substrate 12 and comprises an NMOS gate 32, an N$^+$ source region 14, and an N$^+$ drain region 16. The PMOS structure 30 is formed on an N-well 18 and comprises a PMOS floating gate 34, a P$^+$ source region 20, and a P$^+$ drain region 22. A channel stop region 38 is obliquely implanted underneath the PMOS floating gate 34 for facilitating band-to-band hot electron injection into the PMOS floating gate. A conductor 36 directly electrically couples the NMOS gate 32 to the PMOS floating gate 34. That is, there is a conductive current path from one gate to the other, as opposed to indirectly coupling, such as capacitively coupling. Both gates 32 and 34 are floating, that is, they are not directly electrically coupled to a voltage or current source or sink on the IC, and at the same electrical potential. The conductor may be a polysilicon trace formed at the same time as the gates, or may be a metal or silicide conductor formed later in the fabrication sequence.

However, the above described prior art EEPROM cell 10 suffers from several drawbacks. First, the prior art EEPROM cell 10 consumes a lot of chip area since it is composed of a PMOS structure 30 and a NMOS structure 28, and the extra field oxide layer 24 is needed for isolating the PMOS 30 form the NMOS 28. Second, the prior art EEPROM cell 10 needs an extra channel stop region 38 and formation of conductor 36 for connecting two gates, this, in turns, means extra process steps and thus raised cost.

SUMMARY OF INVENTION

Accordingly, it is a primary object of the claimed invention to provide a high-density single-poly memory device that consumes small per unit chip area. The single-poly memory device according to this invention can be operated under a relatively low voltage and is thus a low power consumption flash memory.

It is another object of the claimed invention to provide a high-density single-poly EEPROM device which is power saving and can be fabricated with conventional CMOS process sequences.

It is still another object of the claimed invention to provide a high-density single-poly EEPROM device and related operation methods.

According to the claimed invention, a single-poly EEPROM is disclosed. The single-poly EEPROM includes a first PMOS transistor that is serially connected to a second PMOS transistor. The first and second PMOS transistors are both formed on an N-well of a P-type substrate. The first PMOS transistor includes a floating gate, a first P$^+$ doped drain region and a first P$^+$ doped source region. The second PMOS transistor includes a gate and second P$^+$ doped source region. The first P$^+$ doped drain region of the first PMOS transistor serves as a drain of the second PMOS transistor. An erase gate extending to the floating gate for erasing the single-poly EEPROM is provided in the P-type substrate.

These and other objectives of the claimed invention will no doubt become obvious to those of ordinary skill in the art after reading the following detailed description of the preferred embodiment, which is illustrated in the various figures and drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings:

FIG. 7 is a chart illustrating operating conditions of the EEPROM device.

DETAILED DESCRIPTION

The preferred embodiment in accordance with the present invention will be discussed in detail with reference to FIG. 2 to FIG. 5 and FIG. 7. It is understood that the type of semiconductor regions, device layout, and polarity of voltages are chosen solely for illustration, and person having ordinary skill in the art would recognize other alternatives, variations, and modifications.

Figure 1:
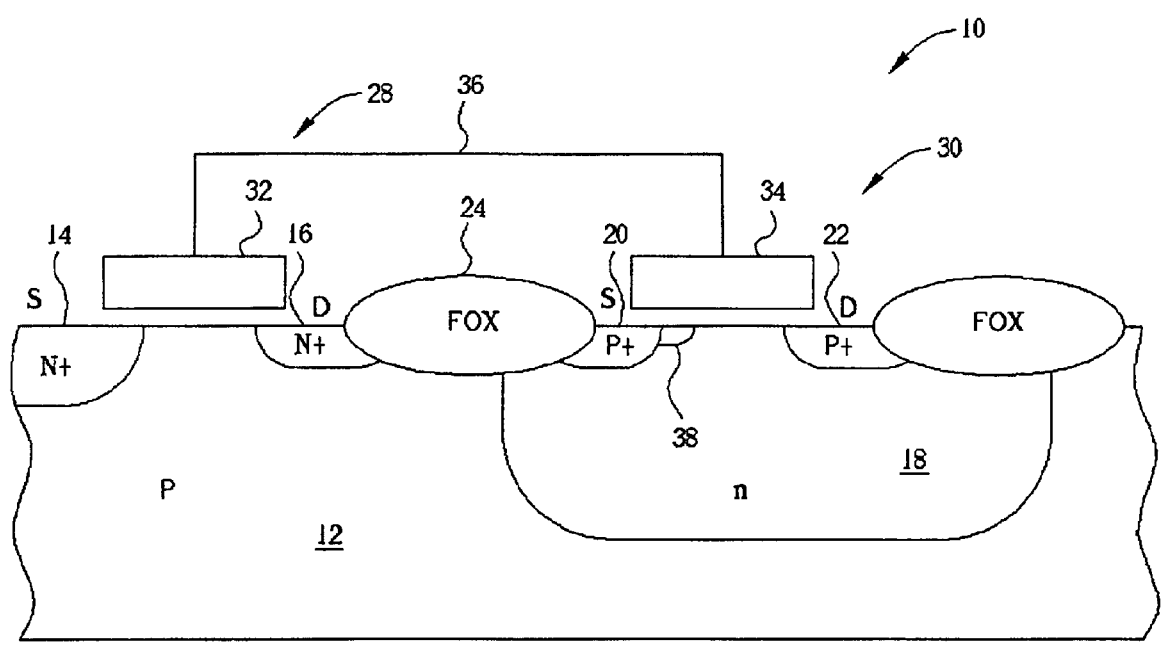
FIG. 1 is a simplified cross section of an EEPROM cell according to the prior art.
Figure 2:
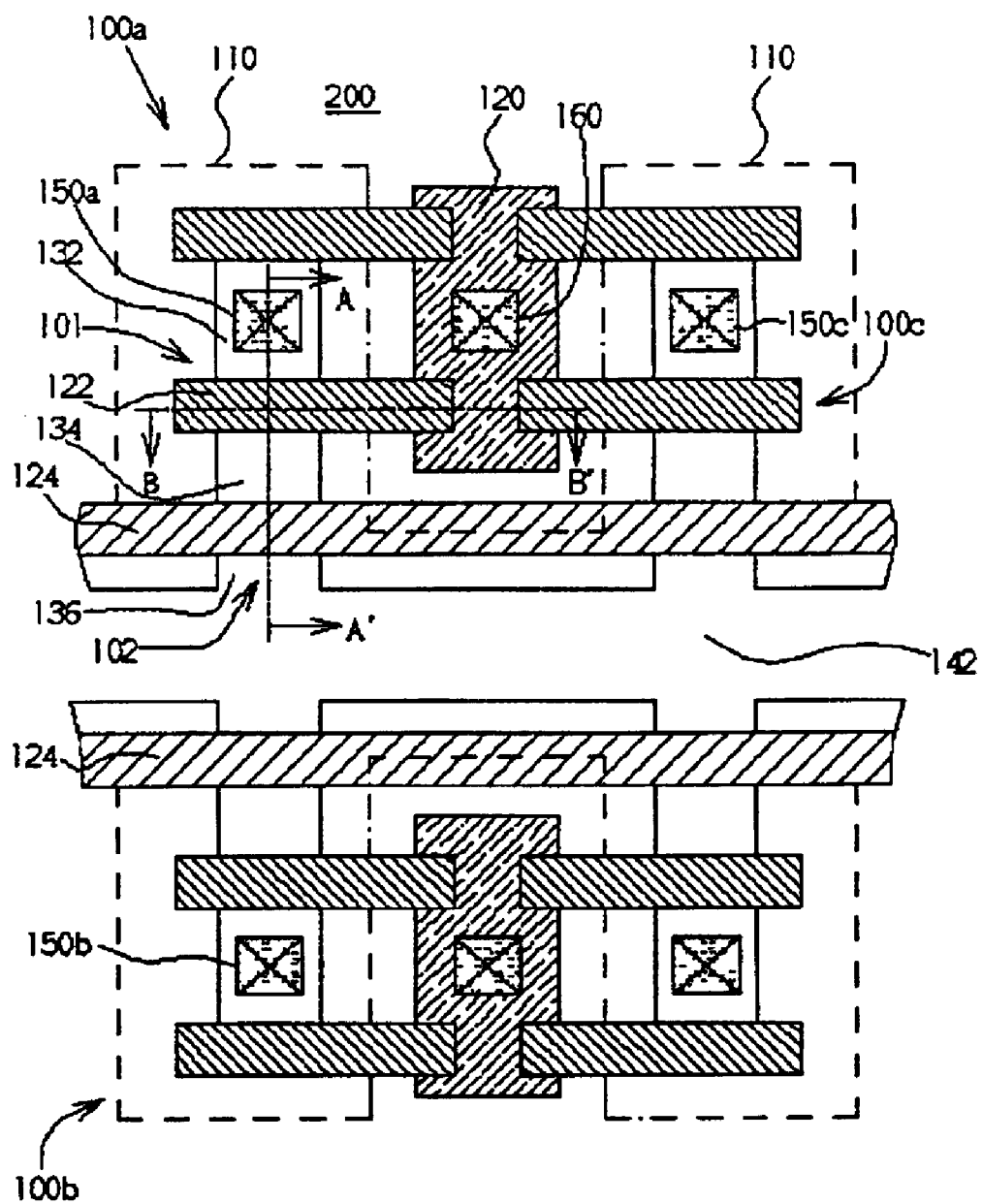
FIG. 2 is a plane view schematically illustrating a partial layout of the single-poly EEPROM device according to one preferred embodiment of this invention.

Please refer to FIG. 2. FIG. 2 is a plane view schematically illustrating a partial layout of the single-poly EEPROM device according to one preferred embodiment of this invention. As shown in FIG. 2, a single-poly EEPROM unit 100a comprises a first PMOS transistor 101 and a second PMOS transistor 102 serially connected to the first PMOS transistor 101. The first PMOS transistor 101 and the second PMOS transistor 102 are formed on an N-well 110. The N-well 110, as indicated by the dashed line in FIG. 2, is implanted and activated in a P-type substrate 200. The first PMOS transistor 101 comprises a floating gate 122, a P+ doped drain region 132 on one side of the floating gate 122, and a P+ doped region 134 on the other side of the floating gate 122. The second PMOS transistor 102 comprises a gate 124, the P+ doped region 134, and a P+ doped source region 136. The P+ doped region 134 functions as a source of the first PMOS transistor 101 and, at the same time, it also functions as a drain of the second PMOS transistor 102, thereby electrically connecting the first PMOS transistor 101 with the second PMOS transistor 102. It is understood that the floating gate 122 consists of a single layer polysilicon according to the present invention, that is, there is no word line or control electrode stacked thereon. The P+ doped drain region 132 is electrically connected to a bit line (not explicitly shown in FIG. 2) through a contact plug 150a. The P+ doped source region 136 of the second PMOS transistor 102 is electrically connected with a source line 142. Preferably, the source line 142 is an embedded P+ doped region that is manufactured simultaneously with the P+ doped source region 136 in an ion implantation process. An EEPROM unit 100b and an EEPROM unit 100c having a memory structure that is similar to the structure of the EEPROM unit 100a are also illustrated in the layout depicted in FIG. 2. The EEPROM unit 100b is electrically connected with the bit line that electrically connects with the contact plug 150a through a contact plug 150b. The EEPROM unit 100c is electrically connected with another bit line through a contact plug 150c.

Still referring to FIG. 2, the single-poly EEPROM unit 100 further comprises an erase gate 120 manufactured in the P-type substrate 200. In accordance with the preferred embodiment of the present invention, the erase gate 120 is an N+ doped region in the P-type substrate 200. When operated, an erase gate voltage ($V_{EG}$) is applied to the erase gate 120 through a contact plug 160. Erasing of the EEPROM unit 100 capitalizes on a so-called edge Fowler-Nordheim mechanism that occurs between the erase gate 120 and the floating gate 122, which will be discussed in detail hereinafter. It should be noted that the implantation of the erase gate 120 is carried out after the definition of the floating gate 122. That is, the implantation of the erase gate pattern is partially masked by the floating gate 122. Accordingly, the floating gate 122 will not overlap with the subjacent heavily doped erase gate 120 substantially. However, it is understood that diffusion of few dopants beneath the edge of the floating gate 122 is possible after going through several thermal processes. Further, as illustrated in FIG. 2, the floating gate 122 has an elongated pattern that overlaps with subjacent N-well 110 and P-type substrate 200 to extend to the erase gate 120. Compared to the prior art EEPROM cell, there is no conductor that connects the floating gate 122 and gate 124 according to the present invention.

Figure 3A:
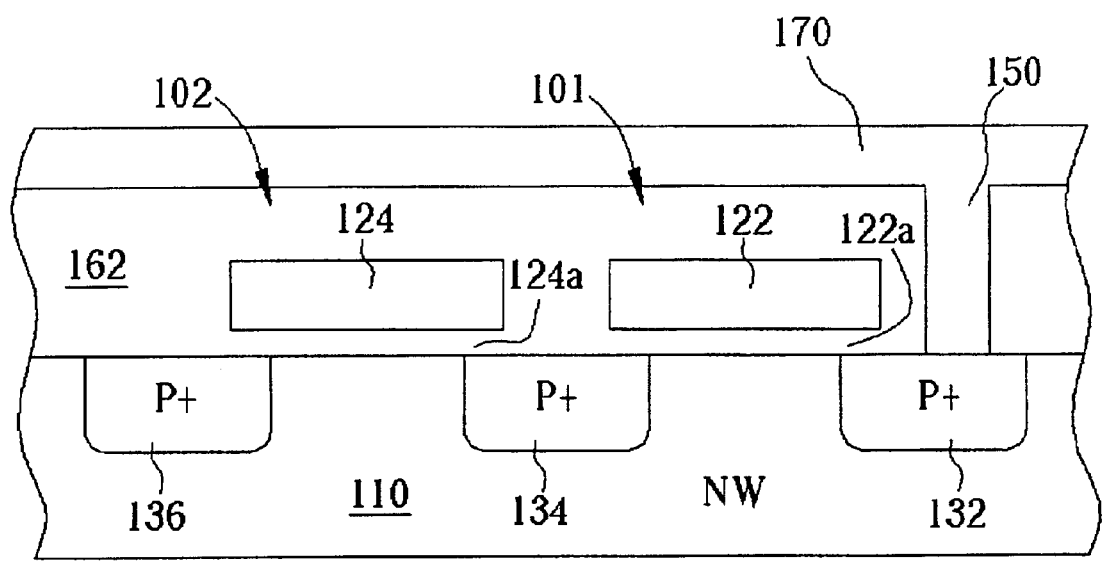
FIG. 3A is a schematic, cross-sectional view of the EEPROM of FIG. 2 along line AA".

Please refer to FIG. 3A. FIG. 3A is a schematic, cross-sectional view of the EEPROM unit 100 of FIG. 2 along line AA". As shown in FIG. 3A, the first PMOS transistor 101 is serially connected to the second PMOS transistor 102. The first PMOS transistor 101 comprises the floating gate 122, the P+ doped drain region 132, P+ doped region 134, and a floating gate oxide layer 122a interposed between the floating gate 122 and the substrate. The second PMOS transistor 102 comprises the gate 124, a gate oxide layer 124a underneath the gate 124, and the P+ doped source region 136. As mentioned above, the P+ doped region 134 of the first PMOS transistor 101 also functions as a drain of the second PMOS transistor 102, thereby electrically the first PMOS transistor 101 with second PMOS transistor 102. The P+ doped drain region 132 of the first PMOS transistor 101 is electrically connected with a bit line 170 through contact plug 150. The contact plug 150 is manufactured in a dielectric film 162 made of, for example, BPSG, PSG, silicon dioxide or the like. The bit line 170 is defined over the dielectric film 160. In the preferred embodiment of the present invention, the thickness of the floating oxide layer 122a, the thickness of the gate oxide layer 124a, and the thickness of gate oxide layer fabricated in a logic circuit area are the same. However, extra thermal processes may be carried out to increase the thickness of the floating gate oxide layer 122a or the thickness of the gate oxide layer 124a. In either case, the simplified EEPROM device of this invention can be combined with standard CMOS semiconductor processes.

Figure 3B:
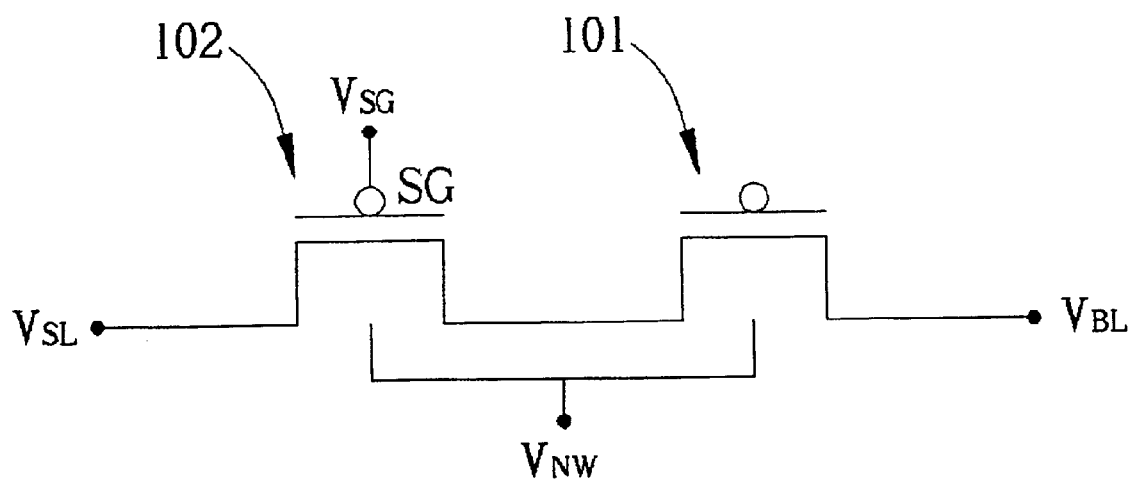
FIG. 3B is an equivalent circuit corresponding to the EEPROM unit depicted in FIG. 3A.
Figure 3C:
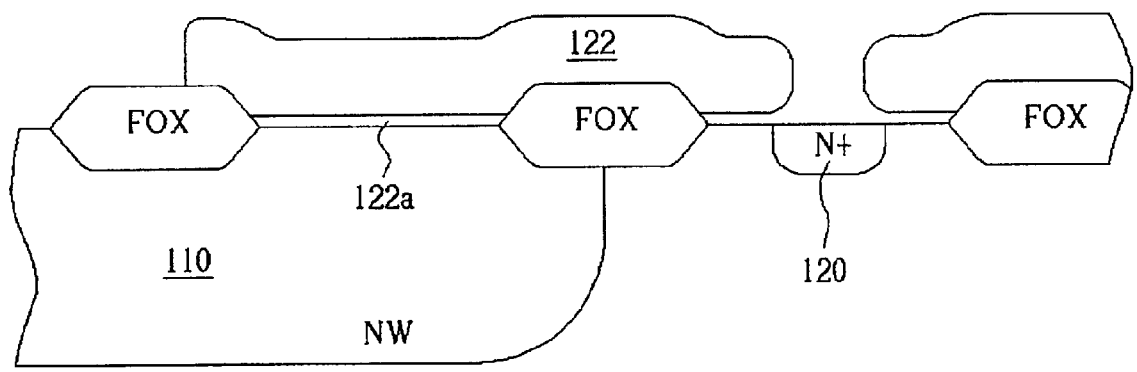
FIG. 3C is a schematic, cross-sectional view of the EEPROM of FIG. 2 along line BB".

Please refer to FIG. 3C with reference to FIG. 2. FIG. 3C is a schematic, cross-sectional view of the EEPROM unit 100 of FIG. 2 along line BB". As shown in FIG. 3C, in the preferred embodiment of the present invention, the floating gate 122 overlies oxide layer (FOX), N-well 110, P-type substrate 200, and extends to the erase gate 120. It is understood that the drawings are exemplary and are not drawn to scale. In effect, the laterally extending floating gate 122 only slightly overlaps with the erase gate 120 at an edge area of the floating gate 122. This overlapping between the edge of the floating gate 122 and the subjacent erase gate 120, as mentioned before, is caused by diffusion of few dopants in the erase gate 120 area after going through a series of thermal processes. As mentioned, the implantation of the erase gate 120 is carried out after the definition of the floating gate 122. That is, the implantation of the erase gate pattern is partially masked by the floating gate 122.

Please refer to FIG. 3B with reference to FIG. 3A, where FIG. 3B is an equivalent circuit corresponding to the EEPROM unit depicted in FIG. 3A. As shown in FIG. 3B, when operated, a bit line voltage ($V_{BL}$) is applied to the P+ doped drain region 132 of the first PMOS transistor 101. The floating gate 122 is floating. An N-Well voltage ($V_{NW}$) is applied to the N-well 110. The second PMOS transistor 102 acts as a select transistor. A select gate voltage ($V_{SG}$) or word line voltage ($V_{WL}$) is applied to the select gate 124 of the second PMOS transistor 102. A source line voltage ($V_{SL}$) is applied to the P+ doped source region 136 of the second PMOS transistor 102. A P-Well voltage ($V_{PW}$) is applied to the P-type substrate.

The operation of the EEPROM according to this invention will now be described in detail with reference to an exemplary operation chart (see FIG. 7), FIG. 3A and FIG. 3B. In FIG. 7, the first (most left) column demonstrates different operation statuses including programming, reading, and erasing of the EEPROM according to this invention. The operation voltage conditions regarding writing data "1" into a selected memory cell are demonstrated in the first row of FIG. 7. The operation voltage conditions regarding writing data "0" into a selected memory cell are demonstrated in the second row of FIG. 7. The operation voltage conditions regarding reading data stored in memory cells are demonstrated in the third row of FIG. 7. The operation voltage conditions regarding erasing data stored in memory cells are demonstrated in the fourth row of FIG. 7. First, referring to the first row of FIG. 7, when programming the EEPROM (writing data "1"), a relatively low-level word line voltage $V_{WL}$ (or $V_{SG}$), for example, 0V, is applied to the select gate 124 of a selected EEPROM unit. A same low-level bit line voltage $V_{BL}$ as the low-level word line voltage $V_{WL}$ for example, 0V, is applied to the P$^+$ doped drain region 132 of the first PMOS transistor 101 of the selected EEPROM unit. Voltages applied to the P-type substrate 200, the N-well 110, the source line 142, and the erase gate 122 ($V_{PW}$, $V_{NM}$, $V_{SL}$, and $V_{EG}$) are 0V, 5~7V, 5~7V, and 0V, respectively. The un-selected word line is applied with a voltage ($V_{WL(un-selected)}$) having a voltage level same as $V_{SL}$, for example, 5~7V. The un-selected bit line is applied with a voltage ($V_{BL(un-selected)}$) having a voltage level also same as $V_{SL}$, for example, 5~7V. The floating gate 122 is in a floating state. As seen in the second row of FIG. 7, when writing data "0" into a selected EEPROM unit, a relatively high-level bit line voltage $V_{BL(selected)}$, for example, 5~7V, is applied to the P$^+$ doped drain region 132 of the first PMOS transistor 101 of the selected EEPROM unit.

Figure 4:
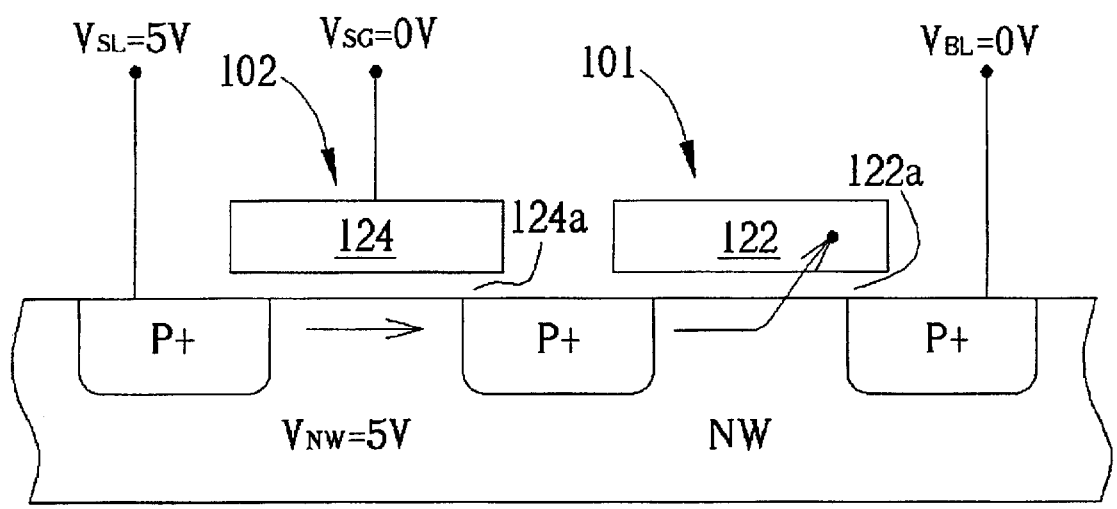
FIG. 4 is a cross-sectional diagram schematically illustrating the writing operation on a selected EERPOM unit associated with a first row of FIG. 7.

Please refer to FIG. 4 with reference to FIG. 7. FIG. 4 is a cross-sectional diagram schematically illustrating the writing operation on a selected EERPOM unit associated with the first row of FIG. 7. As shown in FIG. 4, a selected EERPOM unit is in the following exemplary voltage condition in accordance with the present invention: a word line voltage $V_{WL}$=0V, a bit line voltage $V_{BL}$=0V, floating gate 122 floating, a source line voltage $V_{SL}$=5V, an N-well voltage $V_{NW}$=5V, a P-substrate voltage $V_{PW}$=0V, and an erase gate voltage $V_{EG}$=0V. Under the above voltage condition, a relatively low-level coupling voltage of about −1~−2V will be sensed by the floating gate 122 due to capacitive coupling effect, thereby turning on a P channel under the floating gate 122. Hot carriers such as electrons tunnels through the floating gate oxide layer 122a by way of the turned on P channel and finally trapped inside the floating gate 122.

Figure 5:
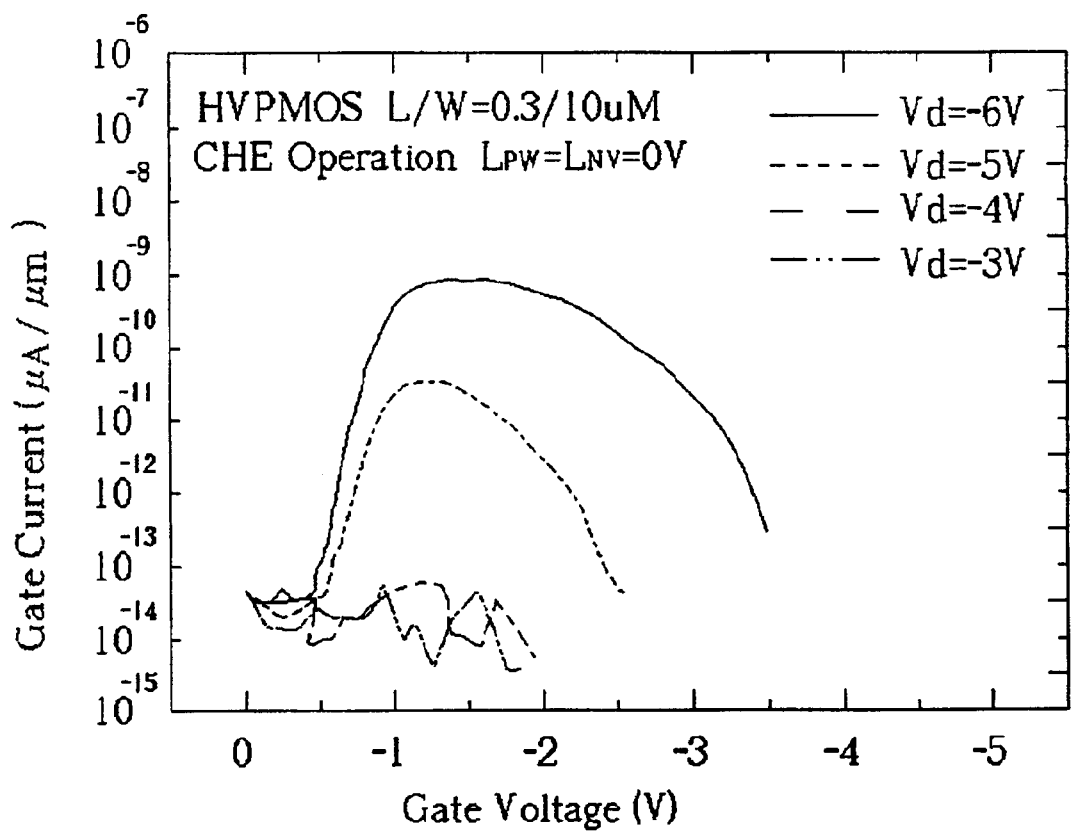
FIG. 5 plots the gate currents versus gate voltages of the floating gate at different drain to N-well bias ($V_d = V_{BL} - V_{NW}$).

Please refer to FIG. 5 with reference to FIG. 4, where FIG. 5 plots the gate currents versus gate voltages of the floating gate at different drain to N-well 110 bias ($V_d$=$V_{BL}$−$V_{NW}$). As shown in FIG. 5, at a drain voltage bias $V_d$=−5V, for example, the floating gate 122 acquires a relatively low-level coupling voltage of about −1~−2V. At the same time, the P channel is just turned on and reaches a gate current approaching a maximum value of about 5×10$^{-11}$ μA/μm. In other words, it is clear that a better performance during the writing operation can be achieved according to the present invention, since the gate current to drain current ratio ($I_g/I_d$) is improved.

Referring to the third row of FIG. 7 with reference to FIG. 3B, when reading the EEPROM, a relatively low-level word line voltage $V_{WL}$ (or $V_{SG}$) for example, 0V, is applied to the select gate 124 of a selected EEPROM unit. The un-selected word line is applied with a relatively high-level voltage of, for example, 3.3V. A selected bit line voltage $V_{BL(selected)}$ of, for example, 1.8V, is applied to the P+ doped source region 134 of the first PMOS transistor 101 of the selected EEPROM unit. The un-selected bit line is applied with a voltage $V_{BL(un-selected)}$=3.3V. Voltages applied to the P-type substrate 200, the N-well 110, the source line 142, and the erase gate 122 ($V_{PW}$, $V_{NM}$, $V_{SL}$, and $V_{EG}$) are 0V, 3.3V, 3.3V, and 3.3V, respectively. The floating gate 122 is in a floating state.

Referring to the fourth row of FIG. 7 with reference to FIG. 3B, when erasing the EEPROM, a relatively low-level word line voltage $V_{WL}$ (or $V_{SG}$), for example, 0V, is applied. A relatively low-level bit line voltage $V_{BL}$ of, for example, 0~5V, is applied to P$^+$ doped drain recion 132 of the first PMOS transistor 101. Voltages applied to the P-type substrate 200, the N-well 110, the source line 142 ($V_{PW}$, $V_{NM}$, $V_{SL}$) are a relatively low-level voltage of about 0V. A relatively high-level voltage, for example, an erase gate voltage $V_{EG}$=5~7V, is applied to the erase gate 120. The floating gate 122 is in a floating state. Erasing of the EEPROM unit 100 capitalizes on a so-called edge Fowler-Nordheim mechanism that occurs between the edge of the floating gate 122 and the subjacent erase gate 120. It is advantageous that at the very beginning stage of the erasing operation, electrons trapped in the floating gate 122 help to span bit line voltage ($V_{BL}$) through entire channel region under the floating gate, thereby facilitating the "pull-out" motion of the trapped electrons. On the other hand, as the erasing operation continues, the ejection or erasing rate of the trapped electrons slows down due to disappearing channel caused by reduced electrons in the floating gate 122. This is beneficial since no more mass of electrons at this stage is dragged out of the floating gate 122, that is, over-erase phenomenon of the EEPROM cells is avoided.

Figure 6:
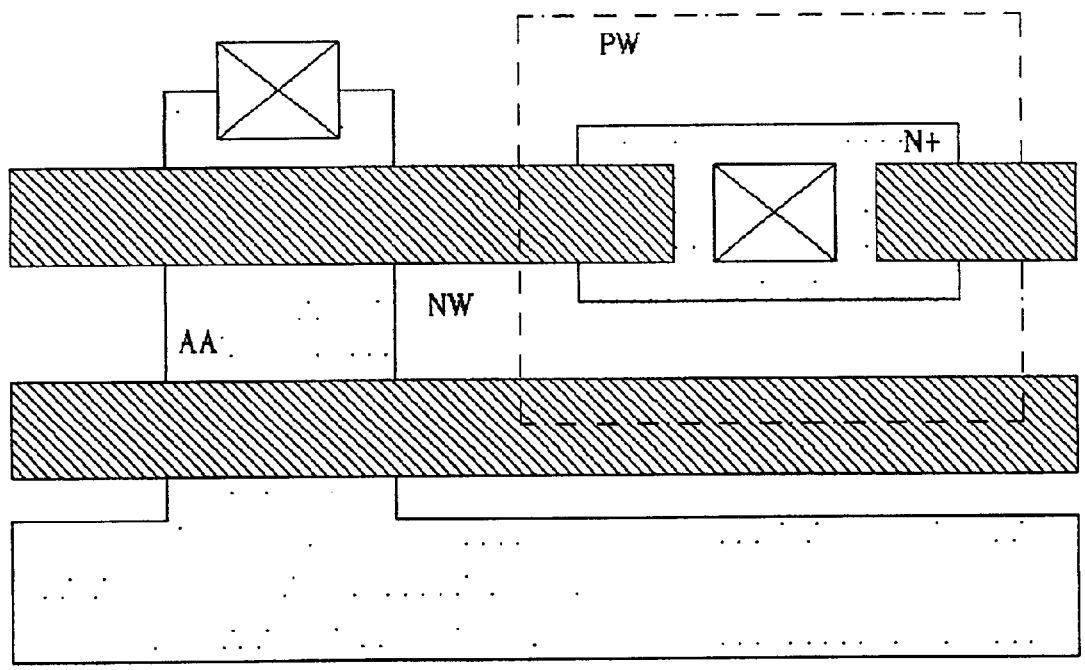
FIG. 6 is a schematic diagram according to another preferred embodiment of the present invention.

Please refer to FIG. 6. FIG. 6 is a schematic diagram illustrating another layout structure according to another preferred embodiment of the present invention. As shown in FIG. 6, the layout structure is particularly suited for byte/byte erase operations. Comparing the layout structure in FIG. 6 with the layout structure depicted in FIG. 2 of this invention, the layout structure depicted in FIG. 2 is suited for page/sector erase operations. Specifically, as illustrated in FIG. 2, the erase gate 120$^+$ area) is shared by four floating gates. The erase gate 120 has a longer side that is substantially in parallel with the bit lines. In FIG. 6, the erase gate (N$^+$ area) is shared by only two floating gates (indicated with hatched lines). These two floating gates are electrically connected to different bit lines, thereby facilitating byte-by-byte erase.

To sum up, the EEPROM of the present invention can be operated at low voltages and can thus achieve the goal of saving energy. The unique design allows a greater gate current to drain current ratio ($I_g/I_d$), which means improved performance, higher data writing efficiency, and lower power dissipation. A gate current ($I_g$) approaching a maximum current is achieved right on the opening or turn on of the PMOS transistor. The erase gate that capitalizes on edge FN effects is also unique. Further, the serially connected PMOS transistors save a great deal of valuable chip area. Moreover, the single-poly EEPROM structure according to the present invention is capable of combing with standard CMOS fabrication processes.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A single-poly EEPROM, comprising:
   a first PMOS transistor serially connected to a second PMOS transistor, wherein the first and second PMOS transistors are both formed on an N-well of a P-type substrate, and wherein the first PMOS transistor includes a floating gate, a first P$^+$ doped drain region, and a first P$^+$ doped source region, the second PMOS transistor includes a gate and second P$^+$ doped source region, and the first P$^+$ doped source region of the first PMOS transistor serves as a drain of the second PMOS transistor; and an N-type doped region formed in the P-type substrate beneath the floating gate serving as an erase gate in the vicinity of the first PMOS transistor, wherein the floating gate of the first PMOS transistor overlaps with the N-well and the P-type substrate and extends to the erase gate.

2. The single-poly EEPROM of claim 1 wherein the N-type doped region formed in the P-type substrate substantially does not overlap with the floating gate.

3. The single-poly EEPROM of claim 1 further comprising a floating gate oxide layer between the erase gate and the floating gate.

4. The single-poly EEPROM of claim 1 wherein when applying a pre-selected drain bias ($V_d$) to the second PMOS transistor, the floating gate of the first PMOS transistor obtains an induced voltage due to capacitance coupling effects, thereby turning on a P-channel under the first PMOS transistor and obtaining a gate current near a maximum value.

5. The single-poly EEPROM of claim 4 wherein $V_d$ is about −5V.

6. The single-poly EEPROM of claim 1 wherein the first PMOS transistor is a single-gate transistor without any control gate formed above the floating gate of the first PMOS transistor.

7. The single-poly EEPROM of claim 1 wherein when erasing the single-poly EEPROM, a pre-selected erase gate bias and a bit line voltage ($V_{BL}$) are applied to the erase gate and the first P$^+$ doped drain region, respectively, so as to pull trapped electrons out of the floating gate by way of FN tunneling.

8. The operation of single-poly EEPROM as set forth in claim 7 wherein at a beginning stage of an erasing operation, electrons trapped in the floating gate help to span the bit line voltage ($V_{BL}$) through entire channel region under the floating gate, thereby facilitating "pull-out" motion of the trapped electrons, as the erasing operation continues, ejection or erasing rate of the trapped electrons slows down due to disappearing channel caused by reduced electrons in the floating gate, thereby avoiding over-erase phenomenon of the single-poly EEPROM.

9. The single-poly EEPROM of claim 7 wherein pre-selected erase gate bias is positive, and the bit line voltage ($V_{BL}$) is negative.

* * * * *